(12) United States Patent
Huang et al.

(10) Patent No.: US 11,334,100 B2
(45) Date of Patent: May 17, 2022

(54) SELF-CALIBRATED SYSTEM ON A CHIP (SOC)

(71) Applicant: Syntronix Corporation, Hsinchu (TW)

(72) Inventors: Chong Jen Huang, Hsinchu (TW); Yung Cheng Su, Hsinchu (TW); Ting Li Chu, Hsinchu (TW)

(73) Assignee: SYNTRONIX CORPORATION, Hsinchu (TW)

( * ) Notice: Subject to any disclaimer, the term of this patent is extended or adjusted under 35 U.S.C. 154(b) by 241 days.

(21) Appl. No.: 16/867,785

(22) Filed: May 6, 2020

(65) Prior Publication Data

US 2021/0165434 A1    Jun. 3, 2021

(30) Foreign Application Priority Data

Dec. 3, 2019    (TW) ................................ 108144123

(51) Int. Cl.
| | |
|---|---|
| *G05F 1/56* | (2006.01) |
| *G01R 31/319* | (2006.01) |
| *G11C 11/401* | (2006.01) |
| *G01R 35/00* | (2006.01) |

(52) U.S. Cl.
CPC ........... *G05F 1/56* (2013.01); *G01R 31/3191* (2013.01); *G11C 11/401* (2013.01); *G01R 35/00* (2013.01)

(58) Field of Classification Search
CPC ...... G01R 31/00; G01R 31/28; G01R 31/317; G01R 31/3181; G01R 31/319; G01R 31/31903; G01R 31/3191; G01R 31/31912; G05F 1/00; G05F 1/10; G05F 1/46; G05F 1/56; G11C 11/00; G11C 11/21; G11C 11/34; G11C 11/40; G11C 11/401; G11C 11/4063; G11C 11/407; G11C 11/4076; G11C 29/00; G11C 29/04; G11C 2029/0403; G11C 2207/00; G11C 2207/22; G11C 2207/2254; G11C 7/00; G11C 7/22; G11C 7/222
USPC ..... 324/500, 537, 750.01, 750.02, 600, 601, 324/74, 76.11, 130
See application file for complete search history.

(56) References Cited

U.S. PATENT DOCUMENTS

| | | | | |
|---|---|---|---|---|
| 5,689,203 | A * | 11/1997 | Geist | ................... G01D 18/008 327/342 |
| 7,365,588 | B2 * | 4/2008 | Nishikawa | ............... H03K 5/13 327/344 |
| 7,742,893 | B2 * | 6/2010 | Confalonieri | ........ H03H 7/0153 360/78.04 |

(Continued)

*Primary Examiner* — Hoai-An D. Nguyen
(74) *Attorney, Agent, or Firm* — Muncy, Geissler, Olds & Lowe, P.C.

(57) ABSTRACT

A self-calibrated system on a chip includes a semiconductor substrate, at least one silicon intellectual property (SIP) circuit including dynamic random access memories (DRAMs), a calibration circuit, and a function circuit, a cyclic oscillator, and a control circuit. Each DRAM has a coarsely-tuned capacitance value and a coarsely-tuned resistance value. The calibration circuit has a finely-tuned capacitance value and a finely-tuned resistance value. The cyclic oscillator transmits an oscillating clock signal to the control circuit to choose and provide the coarsely-tuned capacitance value, the coarsely-tuned resistance value, the finely-tuned capacitance value and the finely-tuned resistance value for the function circuit, thereby adjusting a function parameter.

11 Claims, 3 Drawing Sheets

(56) References Cited

U.S. PATENT DOCUMENTS

| | | | | |
|---|---|---|---|---|
| 7,756,663 B2* | 7/2010 | Han | ...................... | H04B 17/21 |
| | | | | 702/85 |
| 8,102,187 B2* | 1/2012 | Batra | ...................... | G11C 7/04 |
| | | | | 326/38 |
| 8,552,742 B2* | 10/2013 | Huang | .................... | H04B 3/46 |
| | | | | 324/638 |
| 10,498,308 B2* | 12/2019 | Ek | ...................... | G01R 35/005 |

* cited by examiner

SELF-CALIBRATED SYSTEM ON A CHIP (SOC)

This application claims priority for Taiwan patent application no. 108144123 filed on 3 Dec. 2019, the content of which is incorporated by reference in its entirely.

BACKGROUND OF THE INVENTION

Field of the Invention

The present invention relates to a system on a chip, particularly to a self-calibrated system on a chip.

Description of the Related Art

When manufacturing a wafer, there is a process drift in different wafers or different positions of a wafer. Therefore, analog and RF circuits often include a large number of resistors, capacitors, and inductors. Besides, in order to avoid process variations, a variety of calibration mechanisms are added to each Silicon Intellectual Property (SIP) design. The resistors and capacitors are most commonly used to increase the operating range of the circuit. When the process drift occurs, the original characteristics of the circuit can be still recovered using the calibration mechanism.

For example, in a radio frequency identification (RFID) system, a reader transmits a modulation signal by an antenna thereof, then a signal receiver utilizes an antenna with a resonant frequency the same as a resonant frequency of the antenna of the reader to receive the modulation signal, and demodulates the modulation signal. However, because an inductor and a capacitor of the signal receiver have errors, an error usually exists between the resonant frequency of the signal receiver and the resonant frequency of the reader, resulting in the radio frequency identification system having a shorter operation distance. Therefore, integrated circuit process variation increases difficulty for a designer of the signal receiver to design a signal receiver that operates well. However, resistors and capacitors occupy the large area of a chip to increase the fabrication cost. As a result, how to reduce the fabrication cost and maintain the original performance is a critical problem.

To overcome the abovementioned problems, the present invention provides a self-calibrated system on a chip, so as to solve the afore-mentioned problems of the prior art.

SUMMARY OF THE INVENTION

The primary objective of the present invention is to provide a self-calibrated system on a chip, which uses the larger capacitance values and the larger resistance values of dynamic random access memories with small areas to cooperate with smaller capacitance values and smaller resistance values, thereby avoiding the problem with process drift, increasing the operating range of the circuit, and reducing the chip area to be required.

To overcome the abovementioned problems, the present invention provides a self-calibrated system on a chip, which comprises a semiconductor substrate, at least one silicon intellectual property (SIP) circuit, a cyclic oscillator, and a control circuit. The SIP circuit is formed on the semiconductor substrate. The SIP circuit comprises a plurality of dynamic random access memories, a calibration circuit, and a function circuit. The plurality of dynamic random access memories are formed on the semiconductor substrate. Each of the plurality of dynamic random access memories has a coarsely-tuned capacitance value and a coarsely-tuned resistance value. The calibration circuit, formed on the semiconductor substrate, has finely-tuned capacitance values and finely-tuned resistance values. The function circuit is formed on the semiconductor substrate and coupled to the plurality of dynamic random access memories and the calibration circuit, wherein the function circuit has a function parameter. The cyclic oscillator, formed on the semiconductor substrate, generates an oscillating clock signal within a given period. The control circuit is formed on the semiconductor substrate and coupled to the cyclic oscillator, the plurality of dynamic random access memories, and the calibration circuit, wherein the control circuit receives the oscillating clock signal and calculates the number of pulses of the oscillating clock signal. When the number of the pulses is larger than or less than a given value, the control circuit controls the plurality of dynamic random access memories and the calibration circuit to choose and provide the coarsely-tuned capacitance value, the coarsely-tuned resistance value, the finely-tuned capacitance value, and the finely-tuned resistance value for the function circuit based on the number of the pulses and the given value. The function circuit adjusts the function parameter based on the chosen coarsely-tuned capacitance value, the chosen coarsely-tuned resistance value, the chosen finely-tuned capacitance value, and the chosen finely-tuned resistance value.

In an embodiment of the present invention, each of the plurality of dynamic random access memories further comprises a vertical resistor, a first transistor switch, and a vertical capacitor. The vertical resistor, formed on the semiconductor substrate, has the coarsely-tuned resistance value. The first transistor switch, formed on the semiconductor substrate, has a first control electrode, a first connecting electrode, and a second connecting electrode, wherein the first connecting electrode is coupled to the function circuit through the vertical resistor, and the first control electrode is coupled to the control circuit. The vertical capacitor, formed on the semiconductor substrate and coupled to the second connecting electrode, has the coarsely-tuned capacitance value, wherein the function circuit adjusts the function parameter based on the coarsely-tuned resistance value of the vertical resistor and the coarsely-tuned capacitance value of the vertical capacitor when the control circuit turns on the first transistor switch.

In an embodiment of the present invention, the calibration circuit further comprises a plurality of calibrators formed on the semiconductor substrate, wherein the plurality of calibrators respectively have the finely-tuned capacitance values and respectively have the finely-tuned resistance values, the plurality of calibrators are coupled to the control circuit and the function circuit, and when the number of the pulses is larger than or less than the given value, the control circuit controls the plurality of calibrators to choose the finely-tuned capacitance value and the finely-tuned resistance value based on the number of the pulses and the given value.

In an embodiment of the present invention, each of the plurality of calibrators further comprises a second transistor switch, a horizontal resistor and a horizontal capacitor. The second transistor switch, formed on the semiconductor substrate, has a second control electrode, a third connecting electrode, and a fourth connecting electrode, wherein the second control electrode is coupled to the control circuit, and the third connecting electrode is coupled to the function circuit. The horizontal resistor and the horizontal capacitor are formed on the semiconductor substrate, wherein the horizontal resistor has the finely-tuned resistance value, the horizontal capacitor has the finely-tuned capacitance value, the horizontal resistor is coupled to a voltage terminal and electrically connected to the horizontal capacitor in series, the horizontal capacitor is coupled to the fourth connecting electrode of the second transistor switch, and when the control circuit turns on the second transistor switch, the function circuit adjusts the function parameter based on the finely-tuned resistance value of the horizontal resistor and the finely-tuned capacitance value of the horizontal vertical capacitor.

In an embodiment of the present invention, the control circuit further comprises a counter and a decoder. The counter, formed on the semiconductor substrate and coupled to the cyclic oscillator, receives the oscillating clock signal, wherein the counter calculates the number of the pulses to generate a set of digital values based on a rising edge or a falling edge of the pulse within the given period. The decoder, formed on the semiconductor substrate and coupled to the counter, the plurality of dynamic random access memories, and the calibration circuit, receives the set of digital values and controls the plurality of dynamic random access memories and the calibration circuit to choose and provide the coarsely-tuned capacitance value, the coarsely-tuned resistance value, the finely-tuned capacitance value, and the finely-tuned resistance value for the function circuit based on the set of digital values and the given value.

In an embodiment of the present invention, the counter is a shift register.

In an embodiment of the present invention, the cyclic oscillator further receives a reference clock signal, the given period is a cycle of the reference clock signal, and the oscillation frequency of the oscillating clock signal is larger than the reference frequency of the reference clock signal.

In an embodiment of the present invention, the cyclic oscillator is further coupled to a quartz crystal oscillator, and the quartz crystal oscillator generates the reference clock signal.

In an embodiment of the present invention, the control circuit and the function circuit decreases the function parameter when the number of the pulses is less than the given value, and the control circuit and the function circuit increases the function parameter when the number of the pulses is larger than the given value.

In an embodiment of the present invention, the coarsely-tuned capacitance value and the coarsely-tuned resistance value form a first time constant, the finely-tuned capacitance value and the finely-tuned resistance value form a second time constant, and the first time constant divided by the second time constant is larger than or equal to 10.

In an embodiment of the present invention, the function circuit is an analog circuit, a radio-frequency (RF) circuit, a digital circuit, a processor, a static random access memory, or a flash memory.

Below, the embodiments are described in detail in cooperation with the drawings to make easily understood the technical contents, characteristics and accomplishments of the present invention.

DETAILED DESCRIPTION OF THE INVENTION

Figure 1:
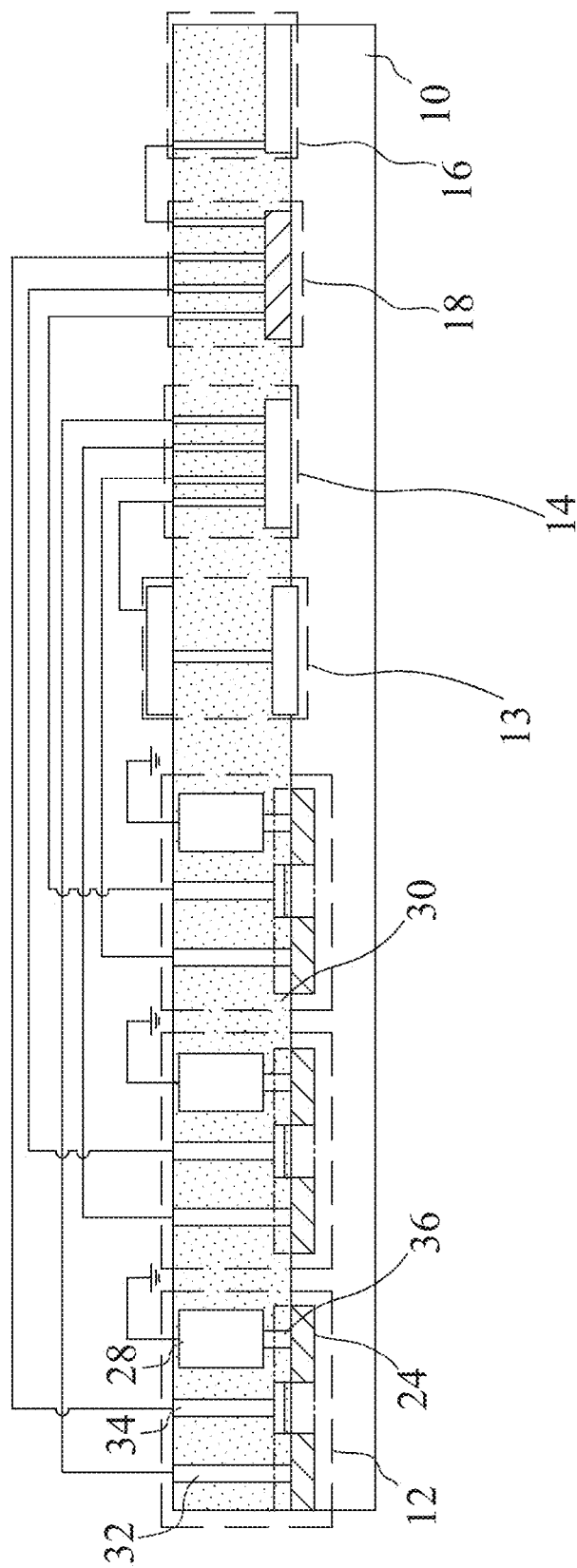
FIG. 1 is a cross-sectional view of a self-calibrated system on a chip according to an embodiment of the present invention.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Unless otherwise specified, some conditional sentences or words, such as "can", "could", "might", or "may", usually attempt to express that the embodiment in the present invention has, but it can also be interpreted as a feature, element, or step that may not be needed. In other embodiments, these features, elements, or steps may not be required.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The phrases "be coupled with," "couples with," and "coupling with" are intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

Figure 2:
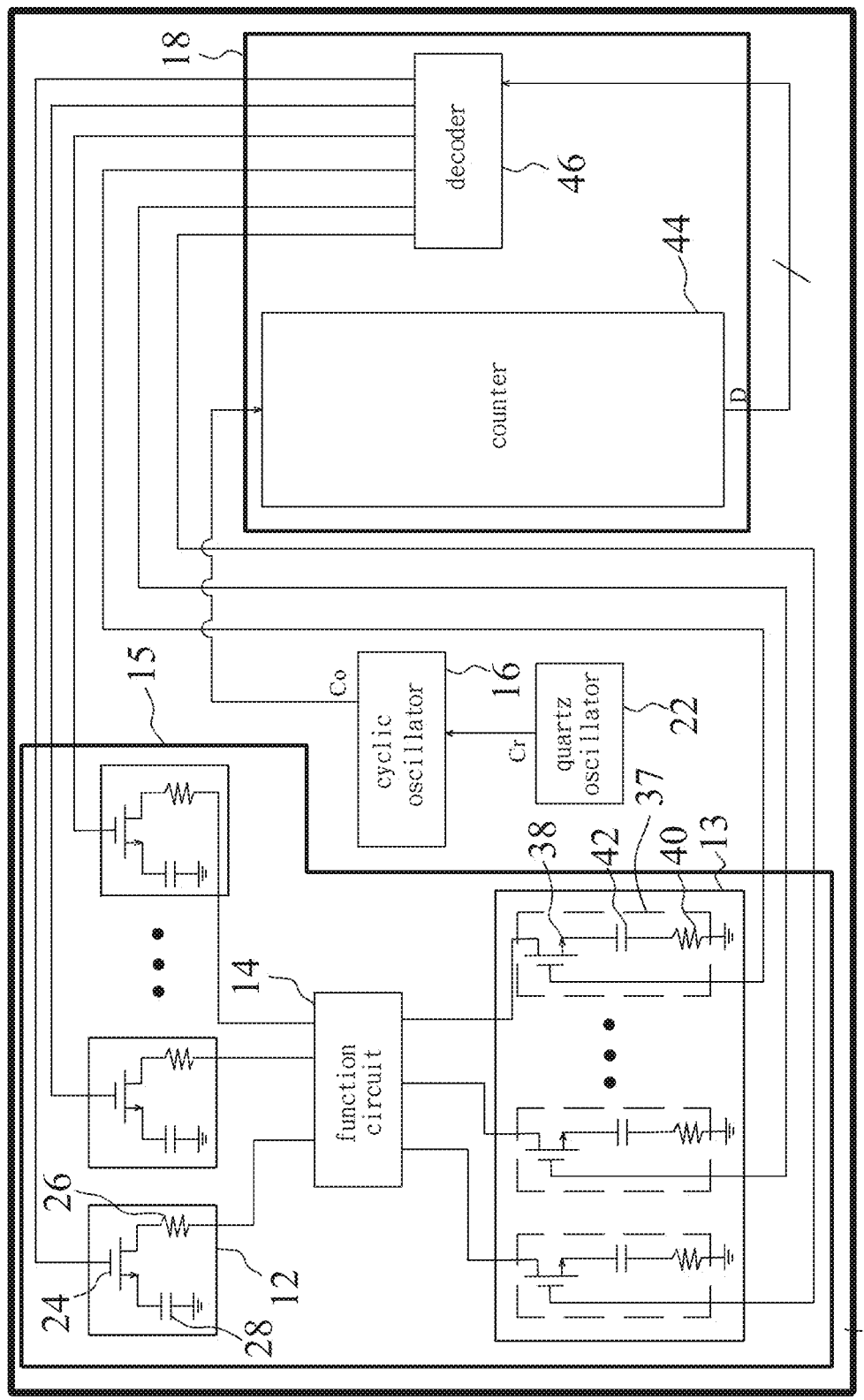
FIG. 2 is a diagram schematically illustrating a self-calibrated system on a chip according to an embodiment of the present invention.
Figure 3:
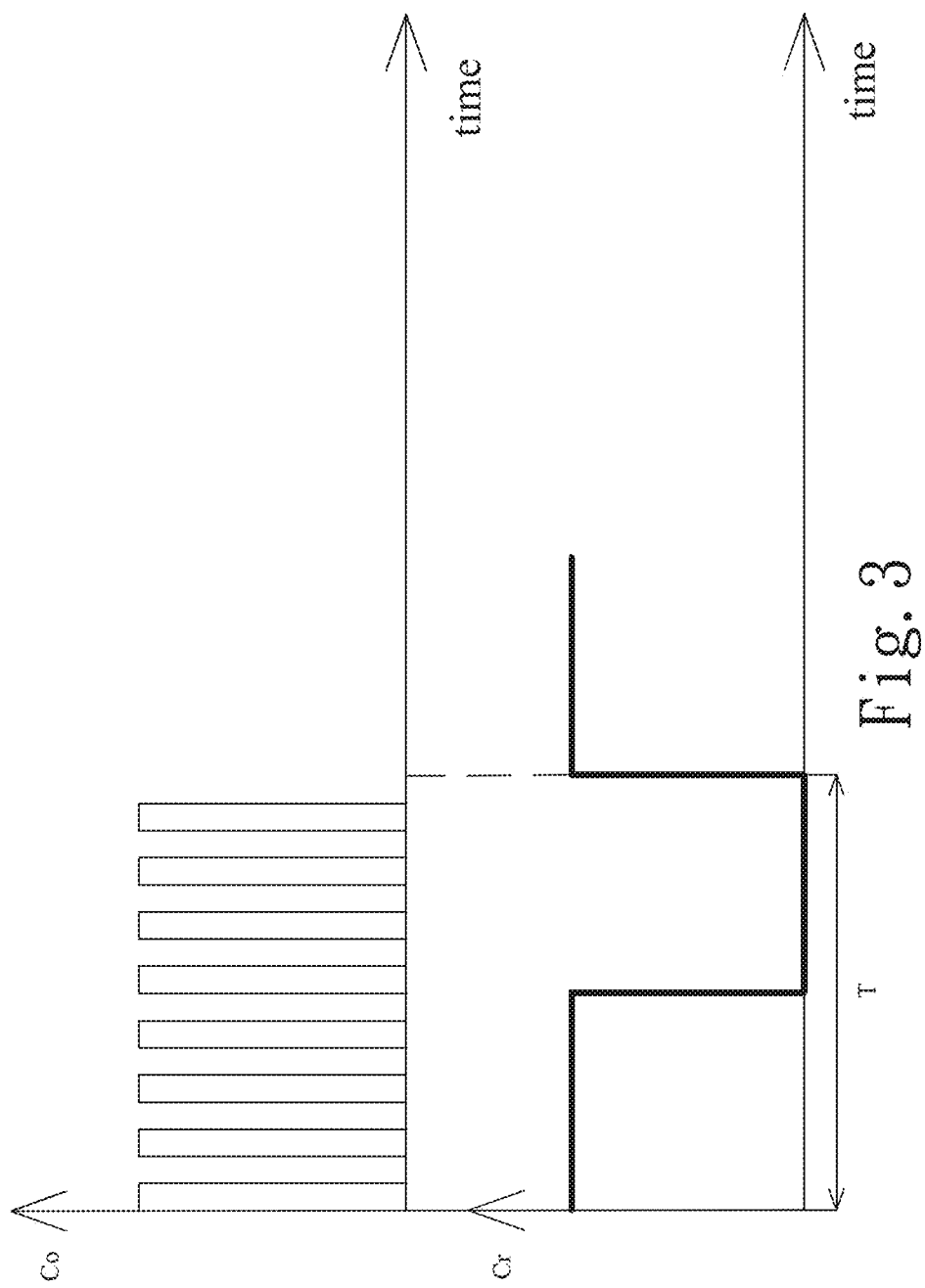
FIG. 3 is a diagram schematically illustrating the waveforms of an oscillating clock signal and a reference clock signal of the present invention.

Referring to FIG. 1, FIG. 2, and FIG. 3, an embodiment of the self-calibrated system on a chip (Soc) of the present invention is introduced as follows. In the embodiment, the self-calibrated system on a chip comprises a semiconductor substrate 10, at least one silicon intellectual property (SIP) circuit 15 including a plurality of dynamic random access memories (DRAMs) 12, a calibration circuit 13, and a function circuit 14, a cyclic oscillator 16, and a control circuit 18. The at least one SIP circuit 15 may comprise a plurality of SIP circuits 15. Each of the plurality of SIP circuits 15 includes a plurality of dynamic random access memories (DRAMs) 12, a calibration circuit 13, and a function circuit 14. In the embodiment, the number of the SIP circuit 15 is one. The SIP circuit 15 may be an analog circuit, a radio-frequency (RF) circuit, a digital circuit, a processor, a static random access memory, or a flash memory. The cyclic oscillator 16 may be a ring oscillator, but the present invention is not limited thereto. Specifically, I/O ports, the SIP circuit 15 including all the DRAMs 12, the calibration circuit 13, and the function circuit 14, the cyclic oscillator 16, and the control circuit 18 are formed on the same semiconductor substrate 10. For a system in package (SIP), dies with different functions are encapsulated in one package to expand the parasitic stray effect that cannot be avoided, reduce the performance, and increase the fabrication cost. For a system in package (SIP), each silicon intellectual property (SIP) circuit has tens of thousands of internal signal lines. Due to the limited size of the chip, the number of I/O ports is limited. It costs higher power consumption for a chip to transmit data to another chip at a lower transmission speed. The present invention is different from a system in package (SIP). The present invention integrates all the intellectual property (SIP) circuits in one chip without limiting the number of I/O ports, so as to avoid the stray effect. In addition, the number of buses in the chip is not limited. Compared with the system in package, the system on a chip communicates with each other through system buses. The system on a chip has higher data transmission speed and lower power consumption and directly designs a transmission bandwidth according to requirements to improve the whole performance.

Each of the plurality of dynamic random access memories 12 has a coarsely-tuned capacitance value and a coarsely-tuned resistance value. The calibration circuit 13 has finely-tuned capacitance values and finely-tuned resistance values. The coarsely-tuned capacitance value is larger than the finely-tuned capacitance value. The coarsely-tuned resistance value is larger than the finely-tuned resistance value. For example, the coarsely-tuned capacitance value and the coarsely-tuned resistance value form a first time constant, the finely-tuned capacitance value and the finely-tuned resistance value form a second time constant, and the first time constant divided by the second time constant is larger than or equal to 10. The function circuit 14 is coupled to all the dynamic random access memories 12 and the calibration circuit 13. The function circuit 14 has a function parameter. The cyclic oscillator 16 generates an oscillating clock signal Co within a given period, wherein the oscillation frequency of the oscillating clock signal Co varies due to the process drift of the system on a chip. The control circuit 18 is coupled to the cyclic oscillator 16, all the dynamic random access memories 12 and the calibration circuit 13. The control circuit 18 receives the oscillating clock signal Co and calculates the number of pulses of the oscillating clock signal Co. When the number of the pulses is larger than or less than a given value, the control circuit 18 controls all the dynamic random access memories 12 and the calibration circuit 13 to choose and provide the coarsely-tuned capacitance value, the coarsely-tuned resistance value, the finely-tuned capacitance value, and the finely-tuned resistance value for the function circuit 14 based on the number of the pulses and the given value. The function circuit 14 adjusts the function parameter based on the chosen coarsely-tuned capacitance value, the chosen coarsely-tuned resistance value, the chosen finely-tuned capacitance value, and the chosen finely-tuned resistance value. Specifically, the control circuit 18 and the function circuit 14 decrease the function parameter when the number of the pulses is less than the given value. The control circuit 18 and the function circuit 14 increase the function parameter when the number of the pulses is larger than the given value. The given value is a standard value to determine whether there is a process drift in the system on a chip. When the number of pulses is different from the given value, the process drift occurs in the system on a chip. The number of pulses quantifies the degree of the process drift. The given value may be written into the control circuit 18 from an external device to build up a backup mechanism. The given value can help the system on a chip operate in an optimal state at any time when the self-calibrated amount is insufficient. The present invention adjusts the function parameter based on the given value, to prevent the function circuit 14 from generating an incorrect signal due to the process drift.

The given period may be built in the cyclic oscillator 16 or provided by a reference clock signal Cr. When the given period is provided by the reference clock signal Cr, the cyclic oscillator 16 is coupled to a quartz crystal oscillator 22. The quartz crystal oscillator 22 generates the reference clock signal Cr. The quartz crystal generates a very stable frequency since temperature has a smaller influence on the quartz crystal. Thus, the quartz crystal is used as an external clock source. The oscillation frequency of the oscillating clock signal Co is larger than the reference frequency of the reference clock signal Cr. For example, the oscillation frequency of the oscillating clock signal Co divided by the reference frequency of the reference clock signal Cr equals to N, wherein N may be a natural number larger than 1. The given period may be a cycle T of the reference clock signal Cr. As shown in FIG. 3, the number of the pulses is 8 in the cycle T. If the given value is 7, the control circuit 18 and the function circuit 14 will increase the resistances, the capacitances, and the function parameter. If the given value is 9, the control circuit 18 and the function circuit 14 will decrease the resistances, the capacitances, and the function parameter. Since the calibration process only needs one cycle T of the reference clock signal Cr, the startup time of the system is not excessively increased. In various environments, the system on a chip of the present invention performs a self-calibrated process in each startup mode to maintain the consistent performance.

In some embodiments of the present invention, each of the plurality of dynamic random access memories 12 further comprises a first transistor switch 24, a vertical resistor 26, and a vertical capacitor 28. The vertical capacitor 28 is formed on the semiconductor substrate 10. The vertical resistor 26 has the coarsely-tuned resistance value. The first transistor switch 24 may be a metal-oxide-semiconductor field effect transistor or a bipolar junction transistor, but the present invention is not limited thereto. In the embodiment, the first transistor switch 24 is implemented with an N-channel metal-oxide-semiconductor field effect transistor. The first transistor switch 24 is formed on the semiconductor substrate 10. The first transistor switch 24 has a first control electrode, a first connecting electrode, and a second connecting electrode. The first control electrode, the first connecting electrode, and the second connecting electrode are respectively implemented with a drain, a gate, and a source. An insulation layer 30 is formed on the semiconductor substrate 10. The insulation layer 30 covers the first transistor switch 24. A first conductive via 32, a second conductive via 34, a third conductive via 36 are formed in the insulation layer 30. The first conductive via 32 is used as the vertical resistor 26. The first connecting electrode is coupled to the function circuit 14 through the vertical resistor 26. The control electrode is coupled to the control circuit 18 through the second conductive via 34. The vertical capacitor 28 is formed on the semiconductor substrate 10 and formed in the insulation layer 30. An end of the vertical capacitor 28 is coupled to the second connecting electrode through the third conductive via 36, and another end of the vertical capacitor 28 is coupled to a voltage terminal, such as a grounding terminal. The vertical capacitor 28 has the coarsely-tuned capacitance value. The function circuit 14 adjusts the function parameter based on the coarsely-tuned resistance value of the vertical resistor 26 and the coarsely-tuned capacitance value of the vertical capacitor 28 when the control circuit 18 turns on the first transistor switch 24. As long as the first transistor switch 24, the vertical resistor 26, and the vertical capacitor 28 are connected in series, the positions of the first transistor switch 24, the vertical resistor 26, and the vertical capacitor 28 can be changed. In some embodiments of the present invention, the calibration circuit 13, the function circuit 14, the cyclic oscillator 16, and the control circuit 18 may be formed on the semiconductor substrate 10, but the present invention is not limited thereto.

In some embodiments of the present invention, the calibration circuit 13 further comprises a plurality of calibrators 37 formed on the semiconductor substrate 10, wherein the plurality of calibrators 37 respectively have the finely-tuned capacitance values and respectively have the finely-tuned resistance values, the plurality of calibrators 37 are coupled to the control circuit 18 and the function circuit 14. When the number of the pulses is larger than or less than the given value, the control circuit 18 controls the plurality of calibrators 37 to choose the finely-tuned capacitance value and the finely-tuned resistance value based on the number of the pulses and the given value.

In some embodiments of the present invention, each of the plurality of calibrators further comprises a second transistor switch 38, a horizontal resistor 40 and a horizontal capacitor 42. The second transistor switch 38 may be a metal-oxide-semiconductor field effect transistor or a bipolar junction transistor, but the present invention is not limited thereto. In the embodiment, the second transistor switch 38 is implemented with an N-channel metal-oxide-semiconductor field effect transistor. The second transistor switch 38 is formed on the semiconductor substrate 10. The second transistor switch 38 has a second control electrode, a third connecting electrode, and a fourth connecting electrode. The second control electrode, the third connecting electrode, and the fourth connecting electrode are respectively implemented with a gate, a drain, and a source. The second control electrode is coupled to the control circuit 18, and the third connecting electrode is coupled to the function circuit 14. The horizontal resistor 40 and the horizontal capacitor 42 are formed on the semiconductor substrate 10. The horizontal resistor 40 has the finely-tuned resistance value, and the horizontal capacitor 42 has the finely-tuned capacitance value. The horizontal resistor 40 is coupled to a voltage terminal such as a grounding terminal and electrically connected to the horizontal capacitor 42 in series. The horizontal capacitor 42 is coupled to the fourth connecting electrode of the second transistor switch 38. When the control circuit 18 turns on the second transistor switch 38, the function circuit 14 adjusts the function parameter based on the finely-tuned resistance value of the horizontal resistor 40 and the finely-tuned capacitance value of the horizontal vertical capacitor 42. As long as the second transistor switch 38, the horizontal resistor 40 and the horizontal capacitor 42 are connected in series, the positions of the second transistor switch 38, the horizontal resistor 40 and the horizontal capacitor 42 can be changed. In the conventional technology, horizontal resistors and horizontal capacitors are used to improve the process drift. However, horizontal resistors and horizontal capacitors occupy a large chip area to increase the fabrication cost. Thus, the present invention replaces a part of horizontal resistors and horizontal capacitors with the vertical resistors 26 and the vertical capacitors 28 of the dynamic random access memories 12. Compared with the horizontal resistors 40 and the horizontal capacitors 42, the vertical resistors 26 and the vertical capacitors 28 have higher height and smaller area, such that the required chip area is reduced. In order to suppress the minimum process drift, the more precise resistance and the more precise capacitance are required. If a larger control range is required, resistors and capacitors occupy a larger area. As a result, the circuit can operate in a wide range to suppress the process drift and recover the original performance. In the present invention, the dynamic random access memories 12 have capacitors with larger and unprecise capacitance values. Compared with the horizontal resistor 40 and the horizontal capacitor 42, the vertical resistor 26 and the vertical capacitor 28 have higher errors in value. Instead, the coarsely-tuned resistance value and the coarsely-tuned capacitance value of the vertical resistor 26 and the vertical capacitor 28 are extremely high, which cooperates with the lower finely-tuned resistance value and the lower finely-tuned capacitance value to enlarge the operating range of the circuit. For example, the coarsely-tuned resistance value and the coarsely-tuned capacitance value form a first time constant, and the finely-tuned resistance value and the finely-tuned capacitance value form a second time constant. For the delay line of a delay locked loop as the function circuit 14, the process drift changes the delay time as the function parameter of the delay line. All the dynamic random access memories 12 and the calibration circuit 13 are used to maintain the original delay time of the delay line. For example, the first time constant is 100 ns and the second time constant is 10 ns. The first time constant is controlled by ten first transistor switches 24 and the second time constant is controlled by fifteen second transistor switches 38. Thus, the total delay time for fine adjustment is 150 ns and the single delay time for coarse adjustment is 100 ns. The total delay time for fine adjustment is larger than the single delay time for coarse adjustment. The delay time for fine adjustment and coarse adjustment overlaps each other to guarantee linear switching does not cause problems. The present invention cooperates with delay time for fine adjustment and coarse adjustment to obtain the required delay time. If the required delay time is 240 ns, two first transistor switches 24 and four second transistor switches 38 are turned on and the remains of the first transistor switches 24 and the second transistor switches 38 are turned off. If the coarse adjustment has an error of +/−30% due to the fabrication process, the fine adjustment precisely compensates the required delay time.

In some embodiments of the present invention, the control circuit 18 further comprises a counter 44 and a decoder 46. The counter 44 may be implemented with a shift register. The counter 44 is formed on the semiconductor substrate 10 and coupled to the cyclic oscillator 16. The counter 44 receives the oscillating clock signal Co. The counter 44 calculates the number of the pulses to generate a set of digital values D based on a rising edge or a falling edge of the pulse within the given period. The rising edge of the pulse represents that a low-level voltage rises to a high-level voltage. The falling edge of the pulse represents that a high-level voltage falls to a low-level voltage. The decoder 46 is formed on the semiconductor substrate 10 and coupled to the counter 44, the first control electrodes of the first transistor switches 24 of the plurality of dynamic random access memories 12, and the second control electrodes of the second transistor switches 38 of the calibration circuit 13. The decoder 46 receives the set of digital values D and controls the plurality of dynamic random access memories 12 and the calibration circuit 13 to choose and provide the coarsely-tuned capacitance value, the coarsely-tuned resistance value, the finely-tuned capacitance value, and the finely-tuned resistance value for the function circuit 14 based on the set of digital values D and the given value.

The operation of the self-calibrated system on a chip is introduced as follows. Firstly, a part of the first transistor switches 24 is turned off and the remains of the first transistor switches 24 are turned on. All the second transistor switches 38 are turned off. The number of the first transistor switches 24 that are turned off is equal to or larger than the number of the first transistor switches 24 that are turned on, but the present invention is not limited thereto. This condition depends on requirements. Then, the quartz crystal oscillator 22 generates the reference clock signal Cr, such that the cyclic oscillator 16 generates the oscillating clock signal Co. The counter 44 receives the oscillating clock signal Co and calculates the number of the pulses within the given period based on the rising edge or the falling edge of the pulse, so as to generate a set of digital values D. Then, the decoder 46 receives the set of digital values D. The decoder 46 turns on the required first transistor switches 24 and the required second transistor switches 38 or turns off the required first transistor switches 24 based on the set of digital values and the given value, thereby choosing the coarsely-tuned capacitance value, the coarsely-tuned resistance value, the finely-tuned capacitance value, and the finely-tuned resistance value, which correspond to the turned-on first transistor switches 24 and the turned-on second transistor switches 38. Thus, the function circuit 14 adjusts the function parameter based on the chosen coarsely-tuned capacitance value, the chosen coarsely-tuned resistance value, the chosen finely-tuned capacitance value, and the chosen finely-tuned resistance value, thereby achieving the calibration purpose.

For example, when the function circuit 14 is a radio-frequency circuit, the function parameter is the operating frequency of the radio-frequency circuit. Specifically, the radio-frequency circuit includes a transmitting circuit and a receiving circuit. The operating frequency of the radio-frequency circuit is regulated. Thus, a phase-locked loop is used to generate the operating frequency. For example, the Bluetooth and Wi-Fi communication operates at $2.4 \times 10^9$ (Hz). Since the high-frequency circuit is easily influenced by the process drift, a calibration circuit with resistors and capacitors is designed to suppress the process drift. The resistance and the capacitance of the calibration circuit form a resonance node of the oscillator of the high-frequency circuit. The oscillator of the phase-locked loop is implemented with a LC oscillation tank. Using an amplifier, the inductance and the capacitance of the oscillator form a resonance frequency such that the oscillator oscillates. The present invention uses all the dynamic random access memories 12 and the calibration circuit 13 to form two oscillation nodes. The oscillation frequency of the oscillator varies since there is a process drift in the resistors, inductors, capacitors, and transistor switches of the chip. Without changing the transistor switches and the inductors, the present invention uses all the dynamic random access memories 12 and the calibration circuit 13 to change the load of oscillation nodes, thereby varying the oscillation frequency and preventing from influence caused by the process drift. In other words, when the process drifts in one direction, the load of the node is changed in the opposite direction to maintain the original function parameter. If the function circuit 14 is an amplifier, the function parameter includes a gain and a phase. The amplifier has an input current source whose magnitude directly influences the properties of the amplifier, namely a gain and a phase. If the current source is connected to all the dynamic random access memories 12 and the calibration circuit 13, the dynamic random access memories 12 and the calibration circuit 13 can change the magnitude of the current source, thereby changing the gain and the phase. If the function circuit 14 is a loop filter, the function parameter may be loop bandwidth. The loop filter includes an amplifier, resistors, and capacitors. If the loop filter is connected to all the dynamic random access memories 12 and the calibration circuit 13, the dynamic random access memories 12 and the calibration circuit 13 can compensate the loop bandwidth of the loop filter.

In conclusion, the present invention uses the larger capacitance values and the larger resistance values of dynamic random access memories with small areas to cooperate with smaller capacitance values and smaller resistance values, thereby avoiding the problem with process drift, increasing the operating range of the circuit, and reducing the chip area to be required.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A self-calibrated system on a chip (Soc) comprising:
   a semiconductor substrate;
   at least one silicon intellectual property (SIP) circuit, formed on the semiconductor substrate, comprising:
      a plurality of dynamic random access memories formed on the semiconductor substrate, wherein each of the plurality of dynamic random access memories has a coarsely-tuned capacitance value and a coarsely-tuned resistance value;
      a calibration circuit, formed on the semiconductor substrate, having finely-tuned capacitance values and finely-tuned resistance values; and
      a function circuit formed on the semiconductor substrate and coupled to the plurality of dynamic random access memories and the calibration circuit, wherein the function circuit has a function parameter;
   a cyclic oscillator, formed on the semiconductor substrate, generating an oscillating clock signal within a given period; and
   a control circuit formed on the semiconductor substrate and coupled to the cyclic oscillator, the plurality of dynamic random access memories, and the calibration circuit, wherein the control circuit receives the oscillating clock signal and calculates number of pulses of the oscillating clock signal, when the number of the pulses is larger than or less than a given value, the control circuit controls the plurality of dynamic random access memories and the calibration circuit to choose and provide the coarsely-tuned capacitance value, the coarsely-tuned resistance value, the finely-tuned capacitance value, and the finely-tuned resistance value for the function circuit based on the number of the pulses and the given value, and the function circuit adjusts the function parameter based on a chosen the coarsely-tuned capacitance value, a chosen the coarsely-tuned resistance value, a chosen the finely-tuned capacitance value, and a chosen the finely-tuned resistance value.

2. The self-calibrated system on a chip according to claim 1, wherein each of the plurality of dynamic random access memories further comprises:
   a vertical resistor, formed on the semiconductor substrate, having the coarsely-tuned resistance value;
   a first transistor switch, formed on the semiconductor substrate, having a first control electrode, a first connecting electrode, and a second connecting electrode, wherein the first connecting electrode is coupled to the function circuit through the vertical resistor, and the first control electrode is coupled to the control circuit; and
   a vertical capacitor, formed on the semiconductor substrate and coupled to the second connecting electrode, having the coarsely-tuned capacitance value, wherein the function circuit adjusts the function parameter based on the coarsely-tuned resistance value of the vertical resistor and the coarsely-tuned capacitance value of the vertical capacitor when the control circuit turns on the first transistor switch.

3. The self-calibrated system on a chip according to claim 1, wherein the calibration circuit further comprises a plurality of calibrators formed on the semiconductor substrate, wherein the plurality of calibrators respectively have the finely-tuned capacitance values and respectively have the finely-tuned resistance values, the plurality of calibrators are coupled to the control circuit and the function circuit, and when the number of the pulses is larger than or less than the given value, the control circuit controls the plurality of calibrators to choose the finely-tuned capacitance value and the finely-tuned resistance value based on the number of the pulses and the given value.

4. The self-calibrated system on a chip according to claim 3, wherein each of the plurality of calibrators further comprises:
   a second transistor switch, formed on the semiconductor substrate, having a second control electrode, a third connecting electrode, and a fourth connecting electrode, wherein the second control electrode is coupled to the control circuit, and the third connecting electrode is coupled to the function circuit; and
   a horizontal resistor and a horizontal capacitor formed on the semiconductor substrate, wherein the horizontal resistor has the finely-tuned resistance value, the horizontal capacitor has the finely-tuned capacitance value, the horizontal resistor is coupled to a voltage terminal and electrically connected to the horizontal capacitor in series, the horizontal capacitor is coupled to the fourth connecting electrode of the second transistor switch, and when the control circuit turns on the second transistor switch, the function circuit adjusts the function parameter based on the finely-tuned resistance value of the horizontal resistor and the finely-tuned capacitance value of the horizontal vertical capacitor.

5. The self-calibrated system on a chip according to claim 1, wherein the control circuit further comprises:
   a counter, formed on the semiconductor substrate and coupled to the cyclic oscillator, receiving the oscillating clock signal, wherein the counter calculates the number of the pulses to generate a set of digital values based on a rising edge or a falling edge of the pulse within the given period; and
   a decoder, formed on the semiconductor substrate and coupled to the counter, the plurality of dynamic random access memories, and the calibration circuit, receiving the set of digital values and controlling the plurality of dynamic random access memories and the calibration circuit to choose and provide the coarsely-tuned capacitance value, the coarsely-tuned resistance value, the finely-tuned capacitance value, and the finely-tuned resistance value for the function circuit based on the set of digital values and the given value.

6. The self-calibrated system on a chip according to claim 5, wherein the counter is a shift register.

7. The self-calibrated system on a chip according to claim 1, wherein the cyclic oscillator further receives a reference clock signal, the given period is a cycle of the reference clock signal, and an oscillation frequency of the oscillating clock signal is larger than a reference frequency of the reference clock signal.

8. The self-calibrated system on a chip according to claim 7, wherein the cyclic oscillator is further coupled to a quartz crystal oscillator, and the quartz crystal oscillator generates the reference clock signal.

9. The self-calibrated system on a chip according to claim 1, wherein the control circuit and the function circuit decreases the function parameter when the number of the pulses is less than the given value, and the control circuit and the function circuit increases the function parameter when the number of the pulses is larger than the given value.

10. The self-calibrated system on a chip according to claim 1, wherein the coarsely-tuned capacitance value and the coarsely-tuned resistance value form a first time constant, the finely-tuned capacitance value and the finely-tuned resistance value form a second time constant, and the first time constant divided by the second time constant is larger than or equal to 10.

11. The self-calibrated system on a chip according to claim 1, wherein the function circuit is an analog circuit, a radio-frequency (RF) circuit, a digital circuit, a processor, a static random access memory, or a flash memory.

* * * * *